(12) United States Patent
Yoon et al.

(10) Patent No.: US 9,484,110 B2
(45) Date of Patent: Nov. 1, 2016

(54) MASK-PROGRAMMED READ ONLY MEMORY WITH ENHANCED SECURITY

(71) Applicant: QUALCOMM Incorporated, San Diego, CA (US)

(72) Inventors: Sei Seung Yoon, San Diego, CA (US); Chulmin Jung, San Diego, CA (US); Esin Terzioglu, San Diego, CA (US); Steven Mark Millendorf, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 89 days.

(21) Appl. No.: 13/953,511

(22) Filed: Jul. 29, 2013

(65) Prior Publication Data

US 2015/0029778 A1  Jan. 29, 2015

(51) Int. Cl.
*G11C 17/12* (2006.01)
*G11C 7/24* (2006.01)

(52) U.S. Cl.
CPC ........ *G11C 17/12* (2013.01); *G11C 7/24* (2013.01)

(58) Field of Classification Search
CPC .................................................. G11C 17/12
USPC ............................................. 365/104, 94, 98
See application file for complete search history.

(56) References Cited

U.S. PATENT DOCUMENTS

| | | | |
|---|---|---|---|
| 4,541,074 A | 9/1985 | Nakano | |
| 4,599,704 A * | 7/1986 | Mazin ........................... | 365/104 |
| 4,888,735 A * | 12/1989 | Lee .................... | G11C 16/0416 257/E27.103 |
| 5,309,389 A | 5/1994 | Golke et al. | |
| 5,412,335 A * | 5/1995 | Jackson ................ | H03H 11/04 327/552 |
| 5,420,818 A * | 5/1995 | Svejda ............. | H03K 19/17704 365/104 |
| 5,866,933 A | 2/1999 | Baukus et al. | |
| 5,959,467 A | 9/1999 | Nolan, III et al. | |
| 5,973,974 A * | 10/1999 | Shirley ............... | G11C 11/4091 327/51 |
| 6,016,277 A * | 1/2000 | Ansel .................... | G11C 11/005 327/540 |
| 6,243,284 B1 * | 6/2001 | Kumagai ............ | G11C 11/5692 365/104 |
| 6,473,334 B1 * | 10/2002 | Bailey ...................... | G11C 8/16 365/154 |
| 7,589,990 B2 * | 9/2009 | Sung ...................... | G11C 17/12 365/103 |
| 7,626,878 B1 | 12/2009 | Lin et al. | |
| 7,929,328 B2 * | 4/2011 | Chen ........................ | G11C 8/08 365/51 |
| 8,149,640 B2 | 4/2012 | Kobatake | |
| 8,509,018 B2 * | 8/2013 | Katoch ............... | G11C 11/4091 365/189.09 |
| 8,605,480 B2 * | 12/2013 | Jain ........................ | G11C 17/12 365/104 |
| 8,897,054 B2 * | 11/2014 | Choserot ................... | G11C 7/12 365/189.05 |
| 2001/0002884 A1 | 6/2001 | Hiraki et al. | |
| 2006/0013041 A1 | 1/2006 | Lin | |
| 2008/0008019 A1 * | 1/2008 | Balasuramanian ...... | G11C 7/02 365/208 |
| 2012/0182818 A1 * | 7/2012 | Huang ................... | G11C 7/067 365/203 |
| 2013/0028002 A1 | 1/2013 | Liu | |

OTHER PUBLICATIONS

Partial International Search Report—PCT/US2014/048061—ISA/EPO—Jan. 27, 2015.
International Search Report and Written Opinion—PCT/US2014/048061—ISA/EPO—May 13, 2015.

\* cited by examiner

*Primary Examiner* — Anthan Tran
*Assistant Examiner* — Mushfique Siddique
(74) *Attorney, Agent, or Firm* — Haynes and Boone, LLP

(57) ABSTRACT

A mask-programmed read-only memory (MROM) has a plurality of column line pairs, each having a bit line and a complement bit line. The MROM includes a plurality of memory cells corresponding to a plurality of intersections between the column line pairs and a plurality of word lines. Each memory cell includes a high Vt transistor and a low Vt transistor.

13 Claims, 5 Drawing Sheets

MASK-PROGRAMMED READ ONLY MEMORY WITH ENHANCED SECURITY

TECHNICAL FIELD

This application relates to a mask-programmed read-only memory (ROM), and more particularly, to a mask-programmed ROM with enhanced security against unauthorized access to its stored data.

BACKGROUND

The stored data in a mask-programmed ROM (MROM) may be highly sensitive data relating to encryption codes or operating parameters. For example, an MROM may store important program code, the basic bootstrapping firmware for a main processor, or the firmware needed to internally control self-contained devices such as graphic cards, hard disks, DVD drives, and TFT screens. It is thus desirable for an MROM to be relatively secure against unauthorized access to its stored data.

The type of mask programming step in an MROM affects its data security. For example, one type of MROM involves the use of a metal layer programming step. Although metal layer programing is quite popular, a sophisticated user may readily reverse engineer the metal layer programming to recover the stored data. For example, a system on a chip (SOC) die that includes embedded MROMs is typically flip-chip mounted onto a package substrate. The active surface for the die with its adjacent metal layers thus faces the package substrate whereas the die's back surface is encapsulated with a mold compound. A reverse engineer may then readily remove the mold compound to expose the die's back surface and image through the exposed die using an electron microscope so as to read the metal layer programming and determine the stored data. The state of metal-layer fuses in fuse-based ROMs may also be recovered using this scanning electron microscope technique.

Another type of MROM uses a channel programming step to selectively provide a channel implant to corresponding memory cell transistors. Depending upon the presence of the channel implant, a memory cell transistor comprises either a high threshold voltage transistor or a low threshold voltage transistor. Ideally, a low threshold voltage transistor memory cell will conduct in response to an assertion of its corresponding word line whereas a high threshold voltage transistor will not. Although channel implants are robust to the type of reverse engineering used to examine metal layer programming, the difference between the high threshold voltage and the low threshold voltage reduces to as little as 100 millivolts as transistor dimensions push into the deep sub-micron regime. Both the low threshold voltage transistors and the high threshold voltage transistors will thus respond to the assertion of the word line at the advanced process nodes such that a separate reference circuit is required to differentiate the high threshold voltage memory cells from the low threshold memory cells, which reduces density and increases system complexity. Furthermore, the low threshold voltage memory cell transistors in channel-implant-programmed MROMs suffer from excessive leakage current.

Accordingly, there is a need in the art for mask programmable ROMs that are robust to unauthorized access yet achieve increased density and reduced power consumption.

SUMMARY

To meet the need in the art for mask-programmed ROMs having enhanced security while achieving increased density and reduced power consumption, a mask-programmed ROM (MROM) is disclosed that includes pairs of column lines or bit lines. Each column line pair includes a bit line and a complement bit line. The MROM includes a plurality of memory cells for each column line pair. Each memory cell comprises a pair of transistors. A first transistor in each transistor pair couples to the bit line whereas a remaining second transistor couples to the complement bit line. Selective channel implants in a mask programming step for each memory cell determines its binary value (logic 1 or logic 0). Either the first or second transistor in each transistor pair receives a channel implant whereas a remaining one of the transistors in the pair does not receive a channel implant. The presence of a channel implant (or lack thereof) determines the threshold voltages for a memory cell's first and second transistors. The mask programming is complementary with regard to each memory cell such that one of the transistors in each transistor pair is a high threshold voltage (high Vt) transistor and a remaining one of the transistors in each pair is a low threshold voltage (low Vt) transistor.

The type of channel implant determines whether the memory cell transistors are low Vt or high Vt transistors. For example, if acceptor dopants are implanted in the channel of an NMOS transistor, the threshold voltage is increased. Conversely, if donor dopants are implanted in the channel of an NMOS transistor, the threshold voltage is reduced. Thus, in one embodiment, a memory cell may be mask programmed to store a first binary value (either logic high or low) by channel implanting the first transistor to raise its threshold voltage so as to be a high Vt transistor. The remaining second transistor would be masked so as to not receive the channel implant and would thus comprise a low Vt transistor. In such an embodiment, a memory cell may be mask programmed to store a second binary value that is the complement of the first binary value by channel implanting the second transistor so it comprises a high Vt transistor. The remaining first transistor would be masked from the channel implant so that it would comprise a low Vt transistor. But it will be appreciated that the presence of a channel implant could instead lower the threshold voltage as discussed above. Regardless of whether the channel implant raises or lowers the threshold voltage, the masking step is complementary so that one of the first and second transistors in each memory cell is a high Vt transistor whereas the remaining transistor is a low Vt transistor. The binary value of a memory cell thus depends upon which one of the first and second transistors is a high Vt transistor or a low Vt transistor.

A plurality of word lines are arranged to form intersections with the column line pairs. The memory cells for each column line pair are arranged by the word lines such that each memory cell is located at a cross point or intersection of a corresponding word line and the corresponding column line pair. The memory cell's word line couples to the gates of the transistor pair. Thus, if the corresponding word line is asserted by raising its voltage, both transistors in the pair will turn on. But the low Vt transistor will turn on to a greater extent than the high Vt transistor.

This difference between the amount of current passed by the high Vt and low Vt transistors is used during a read operation as follows. To read the bit value stored in a particular memory cell, the corresponding column line pair is first precharged to a precharge voltage. Next, the corresponding word line is asserted high by charging it to, for example, the power supply voltage VDD. Both transistors in the transistor pair will then conduct. But the voltage of the column line coupled to the low Vt transistor is discharged more than the remaining line coupled to the high Vt transistor because of the difference in threshold voltages. Thus, by examining the voltage drop difference across the column line pair using a sense amplifier, it can be determined whether the first transistor is a high Vt transistor or a low Vt transistor—or equivalently, whether the second transistor is a low Vt transistor or a high Vt transistor. Once the sense amplifier makes such a determination, it generates a corresponding output bit. For example, if the sense amplifier determines that the first transistor is a high Vt transistor (or equivalently, that the second transistor is a low Vt transistor), it may generate an output bit equaling a first binary value—it is a design choice whether the first binary value is a binary one or a binary zero value. Conversely, if the sense amplifier determines that the first transistor is a low Vt transistor (or equivalently, that the second transistor is a high Vt transistor), it may generate an output bit equaling a second binary value that is the complement of the first binary value.

DETAILED DESCRIPTION

A mask programmed ROM (MROM) is disclosed in which each memory cell includes a pair of transistors. A first transistor in each pair couples to a bit line. The first transistor may thus also be denoted as a bit line transistor. A remaining second transistor in each pair couples to a complement bit line such that the second transistor may also be denoted as a complement hit line transistor. The threshold voltages for the transistors in each pair are complementary such that one of the transistors (either the bit line transistor or the complement bit line transistor) is a low Vt transistor and a remaining transistor is a high Vt transistor. The threshold voltages of the memory cell transistors are configured through a corresponding mask step (or steps) during the manufacture process to receive a channel implant depending upon whether they were masked or not. For each transistor pair, one of the transistors is masked while the remaining transistor receives the channel implant. The following discussion will assume that the channel implant increases the threshold voltage but it will be appreciated that a channel implant can also be configured to reduce the threshold voltage. The memory cells are arranged by word lines such that each memory cell is located at a cross point or intersection of a word line and a column line pair. Each column line pair includes a bit line and a complement bit line.

To mask program a memory cell to store a first binary value, the memory cell's bit line transistor is masked so that it is shielded from the channel implant and configured as a low Vt transistor. Conversely, the unmasked complement bit line transistor receives the channel implant so that it is configured as a high Vt transistor. Similarly, to mask program a memory cell to store a second binary value that is a complement of the first binary value, the channel implant and masking is performed so that the bit line transistor is configured as a high Vt transistor whereas the complement bit line transistor is configured as a low Vt transistor. The binary state of each mask-programmed memory cell thus advantageously does not depend upon any metal layer configuration. In other words, any visual examination of the metal layers for the MROMs disclosed herein provides no information on the stored data within the MROM. In this fashion, security is greatly enhanced as compared to prior art metal-layer-programmed ROMs. Moreover, the complementary usage of a high-Vt transistor and a low-Vt transistor in each memory cell eliminates the need for a separate reference circuit that complicates the design of conventional channel-implant-programmed ROMs. In addition, the leakage currents that vexed conventional channel-implant-programmed ROMS are sharply reduced as discussed further herein. Some example embodiments will now be discussed.

EXAMPLE EMBODIMENTS

Figure 1:
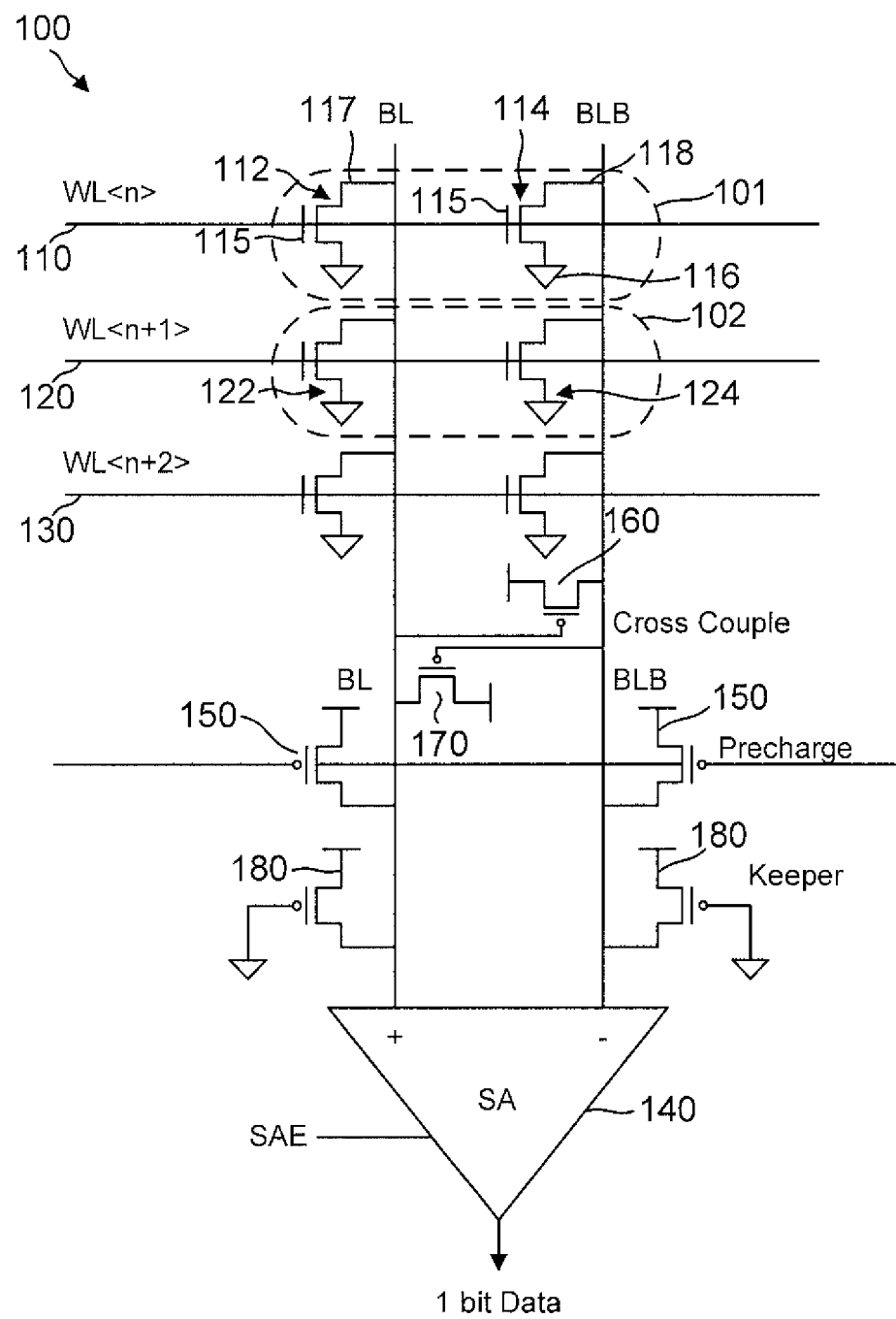
FIG. 1 is a schematic diagram of a column in a mask-programmed ROM (MROM) in accordance with an embodiment of the present disclosure.

Turning now to the drawings, FIG. 1 illustrates an MROM 100 that includes a plurality of memory cells such as memory cells 101 and 102. Each memory cell includes a first NMOS transistor coupled to a bit line (BL) and a second NMOS transistor coupled to a complement bit line (BLB). The bit lines BL and BLB form a column line pair. The memory cells coupled to the column line pair thus form a column of memory cells in MROM 100. The threshold voltages for each first transistor and each second transistor determine the binary state of each memory cell. In memory cell 101, the first transistor is a low Vt transistor 112, which has a drain 117 coupled to the bit line BL. Conversely, the second transistor is a high Vt transistor 114 having a drain 118 coupled to the complement bit line BLB.

MROM 100 includes a plurality of row word lines such as word lines 110, 120, and 130. Word line 110 is the nth word line for MROM, where n is an arbitrary positive integer. Similarly, word line 120 is the (n+1)th word line and word line 130 is the (n+2)th word line. For illustration clarity, the remaining word lines in MROM 100 are not shown. Gates 115 for transistors 112 and 114 are electrically connected to a word line 110 whereas the sources for transistors 112 and 114 couple to ground 116. However, as will be discussed further below, the sources for transistors 112 and 114 may couple to a choke device in an alternative embodiment to limit leakage current. A sense amplifier 140 is configured to make a bit decision by sensing a voltage difference across the column line pair. Low Vt transistor 112 will tend to turn on more fully in response to the raising of word line 110 to a supply voltage VDD whereas high Vt transistor 114 will not turn on so robustly. Thus, bit line BL will discharge towards ground faster than does complement bit line BLB when word line 110 is asserted (when the voltage on word line 110 is raised to the supply voltage VDD). In one embodiment, sense amplifier 140 comprises a means for determining which of the first and second transistors is the high Vt transistor or the low Vt transistor in an accessed one of the memory cells.

The programming of a memory cell in MROM 100 depends upon the threshold voltages for first and second transistors in each memory cell transistor pair. Their threshold voltages are complementary in that one of the transistors in the transistor pair is a low Vt transistor and a remaining one of the transistors is a high Vt transistor. For example, in memory cell 102 the first transistor is a high Vt transistor 122 whereas the second transistor is a low Vt transistor 124. The mask programming of memory cell 102 is thus complementary to the mask programming for memory cell 101. For example, a logical zero value may be deemed to be stored in a memory cell if the first transistor is a low Vt transistor and if the second transistor is a high Vt transistor. Conversely, a logical one value may be deemed to be stored in a memory cell if the first transistor is a high Vt transistor and if the second transistor is a low Vt transistor. One can appreciate that that the assignment of binary values is arbitrary such that a logical one value could instead be deemed to be stored in a memory cell if the first transistor is a high Vt transistor and if the second transistor is a low Vt transistor. The (n+1)th word line 120 couples to the gates of transistors 122 and 124 in memory cell 102. When word line 120 is asserted, the complement bit line BLB will thus be discharged towards ground faster as compared to bit line BL.

In general, a read operation for a particular memory cell in MROM 100 is as follows. The first step of reading the bit value stored in an accessed memory cell comprises precharging bit line BL and complement bit line BLB such as by turning on a pair of precharge PMOS transistors 150 in response to the assertion (active low) of a precharge signal that drives the gates of precharge PMOS transistors 150. Each precharge transistor 150 has its source coupled to the power supply VDD. One precharge transistor 150 has its drain tied to bit line BL whereas a remaining precharge transistor 150 has its drain tied to the complement bit line BLB. Since MROM 100 is sequentially read word line by word line, all memory cells that are accessed by the same word line may be read upon the assertion of the word line. The precharge voltage depends upon the power supply voltage VDD, which in one embodiment may range from 0.8 to 1.2 volt (V). During the precharging stage, the word lines are not asserted. Similarly, sense amplifier 140 is also turned off or decoupled from the column line pair at this time. Once the column line pair is precharged, precharge transistors 150 are turned off so that bit line BL and complement bit line BLB float.

The word lines extend across multiple column line pairs—only a single column line pair is shown in. FIG. 1 for illustration clarity. A targeted word line may be asserted by being raised to VDD so as to turn on the first and second transistors in the memory cells in the various column line pairs crossed by the asserted word line. The voltages for the bit line BL and the complement bit line BLB coupled to an accessed memory cell will then respond depending upon which column line couples to the low Vt transistor and which column line couples to the high Vt transistor. After development of this voltage difference, sense amplifier 140 is enabled to make a bit decision. In one embodiment, the supply voltage VDD is 1 V whereas the high voltage threshold is approximately 400 mV at 25 degree Celsius and the low voltage threshold is approximately 300 mV at 25 degree Celsius. Thus, both the high Vt transistor and the low Vt transistor will turn on in response to the assertion of the corresponding word line but the low Vt transistor begins to turn on faster. Once turned on, both transistors act to conduct currents in their respective channels, which discharges the column lines by varying amounts because the response patterns of the high Vt transistor and the low Vt transistor are different. Since the magnitude of the current generated in the channel of an NMOS transistor depends on the difference between the gate-to-source voltage and the threshold voltage, a larger current is generated in the channel of the low Vt transistor as compared to that generated in the high Vt transistor. The voltage for the column line (either the bit line BL or the complement bit line BLB) coupled to the low Vt transistor will thus drop faster than the voltage of the column line coupled to the high Vt transistor.

Figure 2:
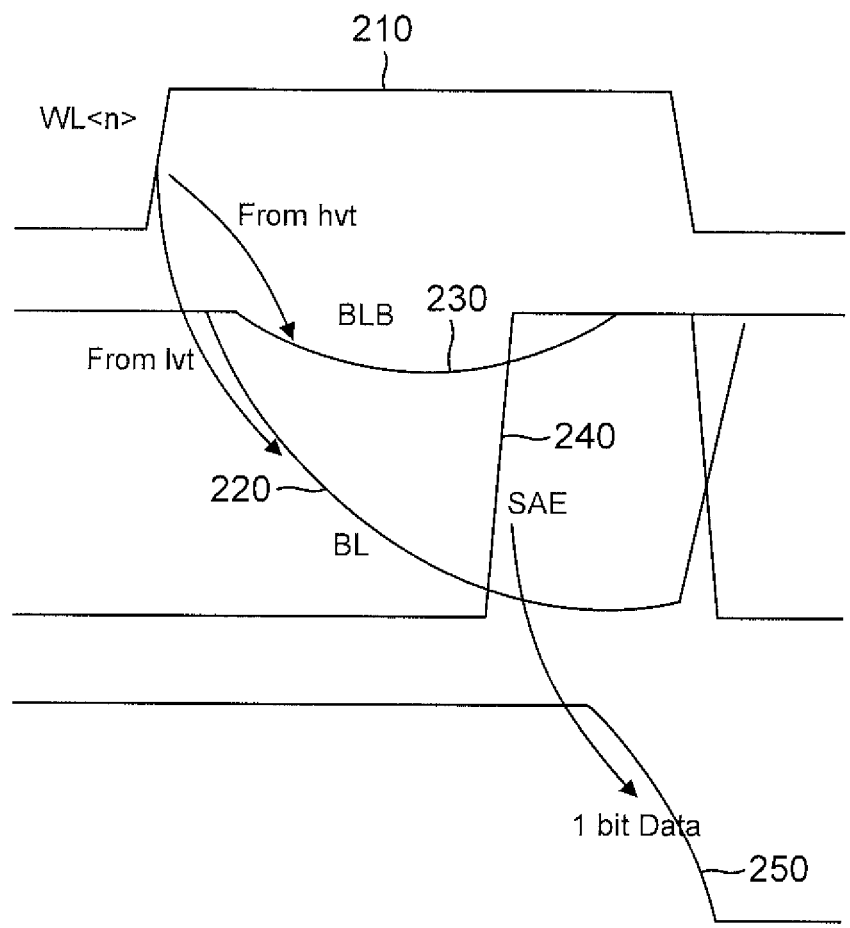
FIG. 2 illustrates the waveforms for various signals in the MROM of FIG. 2.

FIG. 2 illustrates the voltage changes in time on the column line pair in response to a voltage 210 asserted on word line 110. It can be seen that a voltage 220 on the precharged bit line BL starts to drop first as low Vt transistor 112 in memory cell 101 turns on, followed shortly by a voltage 230 on complement bit line BLB dropping as high Vt transistor 114 begins to turn on. But bit line BL voltage 220 drops faster than complement bit line BLB voltage 230. After a sufficient amount of time for this voltage difference to develop between bit lines BL and complement bit line BLB, a sense amplifier enable (SAE) signal 240 is asserted so that sense amplifier 140 may sense the binary value stored in memory cell 101 by determining whether the bit line BL voltage 220 is higher or lower than the complement bit line BLB voltage 230. For example, if memory cell 102 was accessed in a read operation, sense amplifier 140 would determine that bit line BL voltage 220 would remain higher than the complement bit line BLB voltage 230 because in memory cell 102 a high Vt transistor 122 couples to the bit line BL. Based upon the voltage difference for the column line pair, sense amplifier 140 can determine the logical value stored in the accessed memory cell and generate a corresponding data bit 250 to be sent out to a data bus or output. The sensing of the voltage difference across the column line pair and generating of a data bit therefrom by the sense amplifier 140 may be accomplished by a conventional latching process in sense amplifier 140 as known in the memory arts.

To accentuate the voltage difference, the column line pair may be cross-coupled. For example, a pair of PMOS transistors 160 and 170 may be used to implement this cross-coupling as shown in FIG. 1. The gate of PMOS transistor 160 is driven by the voltage on bit line BL whereas the gate of PMOS transistor 170 is driven by the voltage on complement bit line BLB. A drain of PMOS transistor 160 couples to the complement bit line BLB whereas a drain of PMOS transistor 170 couples to the bit line BL. The sources for transistors 160 and 170 couple to the power supply providing the power supply voltage VDD. Given this cross-coupling, the voltage difference across the column line pair is accentuated. For example, should the voltage on bit line BL drop first, transistor 160 will tend to turn on so as to pull the voltage for complement bit line BLB to VDD. Conversely, should the voltage on complement bit line BLB drop first, transistor 170 will tend to turn on so as to pull the voltage on bit line BL to VDD. Since FIG. 2 illustrates the voltage development for a memory cell such as memory cell 101 in which the bit line voltage 220 drops first in response to the word line assertion, the complement bit line voltage 230 is shown to bounce up as the bit line voltage 220 decreases. In this fashion, the cross-coupling from PMOS transistors 160 and 170 assists sense amplifier 140 in making a bit decision.

A weak keeper PMOS transistor 180 may also be coupled to each column line to slow down a common mode voltage drop. Without such devices, the common mode drop on each column line may occur too fast in response to the high Vt and low VT transistors beginning to conduct. Sense amplifier 140 may then be unable to discern which column line voltage discharged the most from such fast discharges. Each keeper PMOS transistor 180 is always on but is configured to be weak. By weakly pulling up the voltage for each column line, keeper transistors 180 act to slow down the column line discharge. The effect of keeper transistors 180 is illustrated in FIG. 2 in that voltages 220 and 230 descend relatively gradually.

One issue with regard to MROM 100 is the amount of leakage current. In particular, the leakage current from the low Vt transistors is relatively high as compared to that from the high Vt transistors. The resulting discharge to ground through these transistors results in faster battery depletion for a battery-powered device. Moreover, as the number of word lines increases, the number of low Vt transistors coupled to each column line will tend to increase. This increased number of low Vt transistors coupled to each column line may discharge each column line by an amount equal to or even greater than the discharge from a low Vt transistor being turned on in an accessed memory cell. Sense amplifier 140 would thus be unable to determine correctly which column line in the column line pair has the lower voltage since it no longer depends upon the threshold voltages for the first transistor and the second transistor in the accessed memory cell. Instead, the discharge of the column lines could be dominated by that produced by the leakage currents in non-accessed memory cells.

Figure 3:
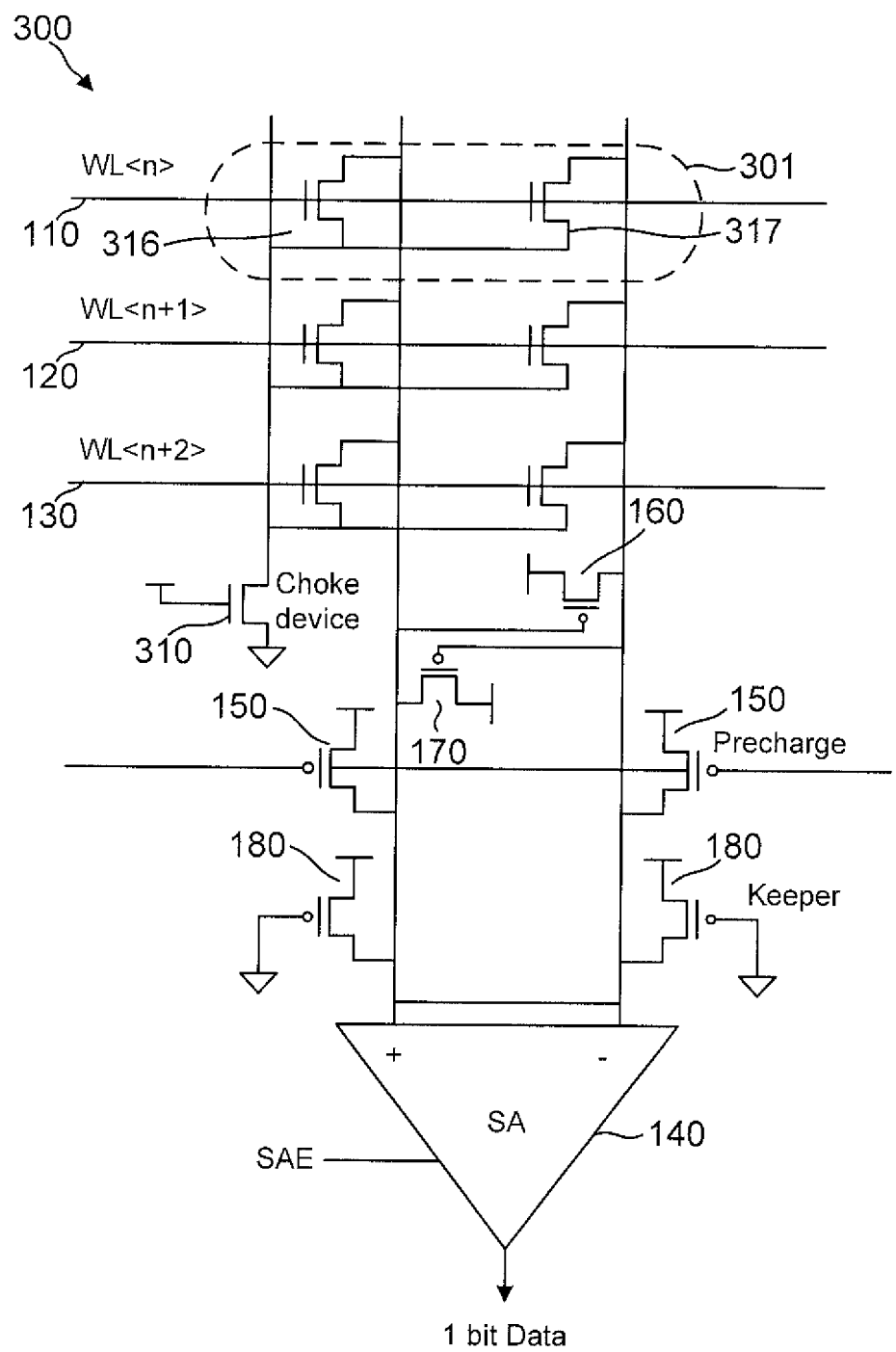
FIG. 3 is a schematic diagram of a column in an MROM including choke devices in accordance with an embodiment of the present disclosure.

To inhibit this leakage current, the memory cell transistor drains may couple to ground though a corresponding choke transistor 310 as shown for an MROM 300 of FIG. 3. Choke transistor 310 is relatively weak compared to the memory cell transistors. In MROM 300, choke transistor 310 is an NMOS transistor having its gate tied to VDD so as to be permanently turned on. The source for choke transistor 310 couples to ground whereas its drain couples to the sources for all the low Vt transistors and to the sources for all the high Vt transistors coupled to the corresponding column line pair (or at least to a subset of the low Vt and high Vt transistors). Because choke transistor 310 is relatively weak, it cannot conduct all the leakage currents from the leaking low Vt transistors such that its drain starts to rise in voltage towards VDD. This rise in the drain voltage on choke transistor 310 in turn means that the gate-to-source voltage decreases for the turned-off low Vt transistors having de-asserted word lines so as to become negative for these low Vt transistors. Since the leakage current is an exponential function of the gate-to-source voltage, choke transistor 310 sharply reduces leakage currents in the non-accessed low Vt transistors. Not only does choke transistor 310 reduce leakage currents in this fashion, it also helps to keep the high Vt transistor off in an accessed memory cell since a high Vt transistor's gate-to-source voltage must exceed the high threshold voltage to turn on. But since the source voltages rise from the effect of choke transistor 310, the high Vt transistors will be inhibited from turning on in response to the assertion of the corresponding word lines. As a result, the voltage on the column line coupled to a high Vt transistor does not drop (or drops very little) in response to an assertion of the corresponding word line.

Figure 4:
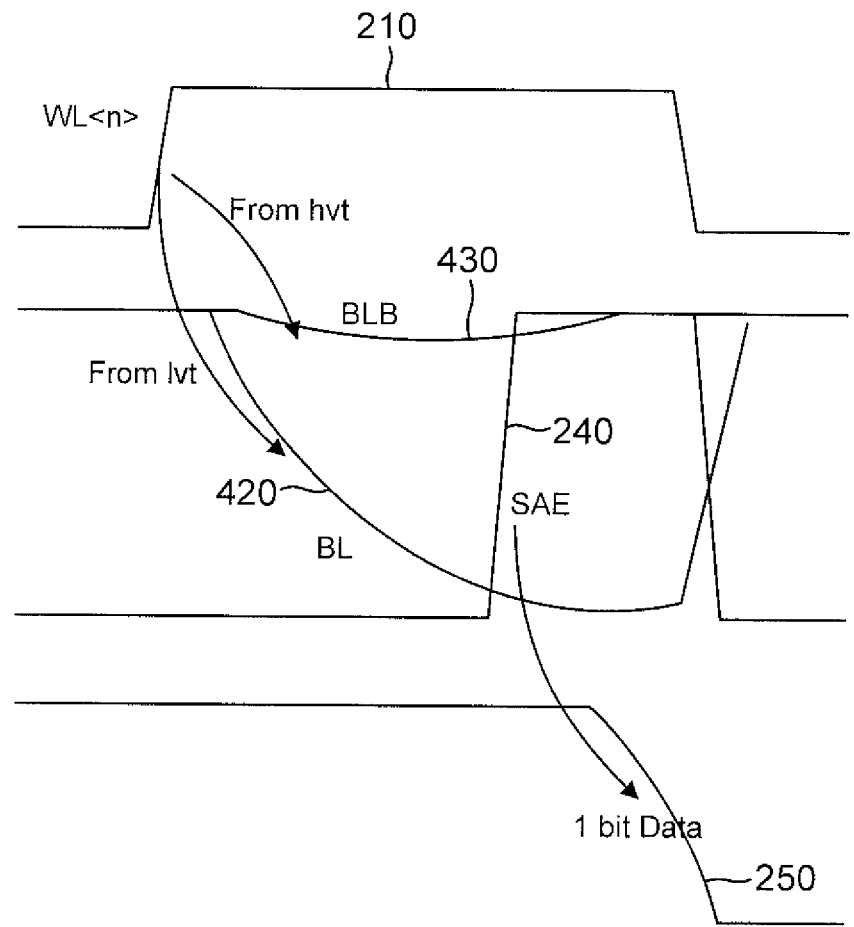
FIG. 4 illustrates the waveforms for various signals in the MROM of FIG. 3.

FIG. 4 illustrates the effect of the choke transistor 310 with regard to a read operation for a memory cell 301 of FIG. 3. In memory cell 301, a low Vt transistor 316 is the first transistor that couples to the bit line BL whereas a high Vt transistor 317 is the second transistor that couples to the complement bit line BLB. Choke transistor 310 thus couples to the sources for transistors 316 and 317. The increased source voltage on high Vt transistor 317 causes a complement bit line voltage 430 to drop very little in response to the assertion of the word line voltage 210 for word line 110. Therefore, choke transistor 310 enhances signal reading and differentiation by the sense amplifier 140, not only by reducing leakage from the low Vt transistors in the non-accessed memory cells, but also by inhibiting the high Vt transistor in the accessed memory cell from turning on to further develop the voltage difference across the column line pair. An example method of operation will now be discussed.

EXAMPLE METHOD OF OPERATION

Figure 5:
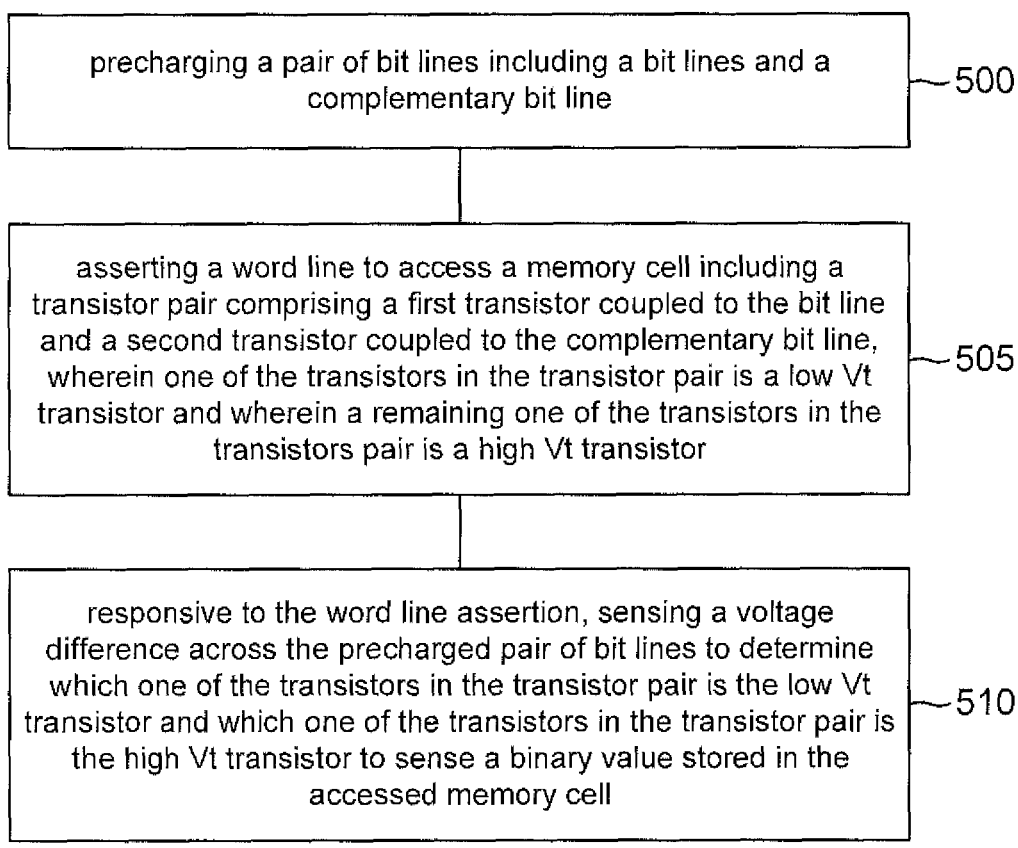
FIG. 5 is a flowchart for an example method of operation for an MROM in accordance with an embodiment of the present disclosure.

A flowchart for an example read operation is shown in FIG. 5. The read operation begins with an act 500 of precharging a pair of column lines including a bit line and a complementary bit line. The read operation continues with an act 505 of asserting a word line to access a memory cell including a transistor pair comprising a first transistor coupled to the bit line and a second transistor coupled to the complementary bit line, wherein one of the transistors in the transistor pair is a low Vt transistor and wherein a remaining one of the transistors in the transistor pair is a high Vt transistor. The read operation concludes with an act 510 of, responsive to the word line assertion, sensing a voltage difference across the column line pair to determine which one of the transistors in the transistor pair is the low Vt transistor and which one of the transistors in the transistor pair is the high Vt transistor to sense a binary value stored in the accessed memory cell.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:
1. A mask-programmed ROM (MROM) comprising:
   a column line pair including a bit line and a complement bit line;
   a plurality of memory cells, wherein each memory cell includes a pair of transistors comprising a first transistor coupled to the bit line and a second transistor coupled to the complement bit line, and wherein for each pair of transistors, one of the first and second transistors is a low threshold voltage (low Vt) transistor and a remaining one of the first and second transistors is a high threshold voltage (high Vt) transistor;
   a sense amplifier configured to sense a voltage difference between the bit line and the complement bit line;
   a choke device coupled between ground and a source of each of the first and second transistors, wherein the choke device is configured to reduce a gate-to-source voltage for the each of the first and second transistors to inhibit leakage current;
   a first PMOS transistor having its gate coupled to the complement bit line and a drain coupled to the bit line; and
   a second PMOS transistor having its gate coupled to the bit line and a drain coupled to the complement bit line.
2. The MROM of claim 1, wherein the first transistors and the second transistors are NMOS transistors.
3. The MROM of claim 1, wherein the choke device comprises an NMOS transistor having a gate coupled to a power supply, a source coupled to ground, and a drain coupled to the sources of the first and second transistors.

4. The MROM of claim 1, wherein a source for the first PMOS transistor and a source for the second PMOS transistor are both coupled to a power supply.

5. The MROM of claim 1, further comprising a pair of keeper devices configured to decrease a common mode voltage drop across the column line pair.

6. The MROM of claim 1, further comprising a pair of precharge transistors configured to precharge the column line pair.

7. A method, comprising
precharging a pair of column lines including a bit line and a complementary bit line;
asserting a word line to access a memory cell including a first transistor coupled to the bit line and a second transistor coupled to the complementary bit line, wherein one of the first and second transistors is a low Vt transistor and wherein a remaining one of the first and second transistors is a high Vt transistor;
responsive to the word line assertion, sensing a voltage difference across the precharged pair of column lines to determine which one of the first and second transistors is the low Vt transistor and which one of the first and second transistors is the high Vt transistor to sense a binary value stored in the accessed memory cell;
coupling a source for the first transistor to ground through a choke device and coupling a source of the second transistor to ground through the choke device to inhibit leakage current; and
decreasing a common mode voltage drop for the column line pair by weakly charging the bit line and the complement bit line through keeper devices.

8. The method of claim 7, further comprising:
responsive to the low Vt transistor discharging one of the precharged column lines lower in voltage than a remaining one of the precharged column lines, turning on a transistor to charge the remaining one of the precharged column lines to a power supply voltage.

9. The method of claim 7, further comprising asserting a sense enable signal after development of the voltage difference to trigger sensing the voltage difference in a sense amplifier.

10. A mask-programmed ROM (MROM) comprising:
a column line pair including a bit line and a complement bit line;
a choke device;
a plurality of memory cells, wherein each memory cell includes a pair of transistors comprising a first transistor coupled to the bit line and a second transistor coupled to the complement bit line, and wherein for each pair of transistors, one of the first and second transistors is a low threshold voltage (low Vt) transistor having a source coupled to ground through the chock device and a remaining one of the first and second transistors is a high threshold voltage (high Vt) transistor having a source coupled to ground through the choke device, wherein the choke device is configured to reduce a gate-to-source voltage for each of the first and second transistors; and
means for sensing a voltage difference between the bit line and the complement bit line to determine which of the first and second transistors is a high Vt transistor or a low Vt transistor in an accessed one of the memory cells;
a first PMOS transistor having its gate coupled to the complement bit line and a drain coupled to the bit line; and
a second PMOS transistor having its gate coupled to the bit line and a drain coupled to the complement bit line.

11. The MROM of claim 10, wherein the means is configured to detect a voltage difference across the column line pair to determine which of the first and second transistors is a high Vt transistor or a low Vt transistor in the accessed one of the memory cells.

12. The MROM of claim 11, wherein the means is further configured to make a bit decision responsive to the determination of which of the first and second transistors is a high Vt transistor or a low Vt transistor in the accessed one of the memory cells.

13. The ROM of claim 10, wherein the first transistors and the second transistors are NMOS transistors.

* * * * *